(12) United States Patent
Lee et al.

(10) Patent No.: US 7,125,747 B2
(45) Date of Patent: Oct. 24, 2006

(54) PROCESS FOR MANUFACTURING LEADLESS SEMICONDUCTOR PACKAGES INCLUDING AN ELECTRICAL TEST IN A MATRIX OF A LEADLESS LEADFRAME

(75) Inventors: Yong-gill Lee, Kaohsiung (TW); Hyung-Jun Park, Kaohsiung (TW); Sang-Bae Park, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 205 days.

(21) Appl. No.: 10/873,152

(22) Filed: Jun. 23, 2004

(65) Prior Publication Data

US 2005/0287709 A1 Dec. 29, 2005

(51) Int. Cl.
*H01L 21/44* (2006.01)
*H01L 21/48* (2006.01)
*H01L 21/50* (2006.01)

(52) U.S. Cl. .................. 438/112; 438/15; 438/123; 257/E21.521; 257/E21.51

(58) Field of Classification Search .......... 438/15, 438/112
See application file for complete search history.

(56) References Cited

U.S. PATENT DOCUMENTS 6,281,047 B1 * 8/2001 Wu et al. ................. 438/113
6,489,218 B1   12/2002 Kim et al. ............... 438/460
6,773,961 B1 * 8/2004 Lee et al. ................. 438/112
6,800,508 B1 * 10/2004 Kimura .................... 438/123
6,872,599 B1 * 3/2005 Li et al. ................... 438/123

\* cited by examiner

*Primary Examiner*—David A. Zarneke
(74) *Attorney, Agent, or Firm*—Troxell Law Office, PLLC

(57) ABSTRACT

A process for manufacturing a plurality of leadless semiconductor packages includes an electrically testing step to test encapsulated chips in a matrix of a leadless leadframe. Firstly, a leadless leadframe having at least a packaging matrix is provided. The packaging matrix defines a plurality of units and a plurality of cutting streets between the units. The leadless leadframe has a plurality of leads in the units and a plurality of connecting bars connecting the leads along the cutting streets. A plated metal layer is formed on the upper surfaces of the leads and the upper surfaces of the connecting bars. After die-attaching, wire-bonding connection, and encapsulation, the leadless leadframe is etched to remove the connecting bars, then two sawing steps are performed. During the first sawing step, the plated metal layer on the upper surface of the connecting bars is cut out to electrically isolate the leads. Therefore, a plurality of chips sealed by an encapsulant on the packaging matrix can be electrically tested by probing which is performed between the first sawing and the second sawing. Thereafter, the encapsulant is cut to form a plurality of individual package bodies of the leadless semiconductor packages during the second sawing.

26 Claims, 10 Drawing Sheets

PROCESS FOR MANUFACTURING LEADLESS SEMICONDUCTOR PACKAGES INCLUDING AN ELECTRICAL TEST IN A MATRIX OF A LEADLESS LEADFRAME

FIELD OF THE INVENTION

The present invention relates to a process for manufacturing leadless semiconductor packages and, more particularly, to a process for manufacturing leadless semiconductor packages including an electrical test in a matrix of a leadless leadframe.

BACKGROUND OF THE INVENTION

As well-known in the field of semiconductor packaging, a leadless leadframe is used as a die carrier in a leadless semiconductor package for smaller footprint and lower manufacturing cost. However, after singulation, a leadless semiconductor package still needs to go through final test via individual test socket for the verification of the electrical performance, therefore, the cost of final test cannot be reduced.

In U.S. Pat. No. 6,489,218, a conditional leadless semiconductor package and its manufacturing process flow are revealed. As shown in FIG. 1, the leadless semiconductor package has a leadless leadframe 10. In each unit, the leadless leadframe 10 has a plurality of leads 11 and a chip pad 12. A plated metal layer 13, such as silver, nickel/gold, is deposited on the upper surface of the leads 11 and the chip pad 12 for enhancing connection of bonding wires 30 between the leadless leadframe 10 and a semiconductor chip 20. The semiconductor chip 20 is attached to the chip pad 12, then a plurality of bonding wires 30 connect the leads 11 of the leadless leadframe 10 with the semiconductor chip 20. Thereafter, an encapsulant 40 seals the semiconductor chip 20 and the bonding wires 30. The process flow for manufacturing the leadless semiconductor packages is shown in FIG. 2, including the step 1 of "providing a leadless leadframe with a packaging matrix", the step 2 of "attaching a plurality of semiconductor chips to the leadless leadframe", the step 3 of "electrically connecting the semiconductor chips with the leadless leadframe", the step 4 of "encapsulating the packaging matrix with an encapsulant", the step 5 "singulating the leadless leadframe", and the step 6 "electrically testing the singulated leadless semiconductor packages". First of all, in step 1, a leadless leadframe 10 with a packaging matrix is provided, a plurality of units are arranged in an array in the packaging matrix. Moreover, the plated metal layer 13 is formed on the upper surface of the leadless leadframe 10 including the cutting streets between the units. Thereafter, in step 2, a plurality of semiconductor chips 20 are attached to the chip pads 12, and then, in step 3, a plurality of bonding wires 30 connect the leads 11 of the leadless leadframe 10 with the semiconductor chips 20. Thereafter, in step 4, an encapsulant seals the packaging matrix to cover a plurality of units, which is the precursor of the package bodies 40 before singulation. Next, in step 5, a plurality of individual leadless semiconductor packages are formed by sawing the encapsulant along the cutting streets instead of punching method. In order to saw the encapsulant easily, a metal layer 14 is plated on the lower surface of the leadless leadframe 10 except for the cutting streets. The cutting streets are exposed from the metal layer 14. Therefore, the metal layer 14 is used as an etching mask. After etching the cutting streets, a plurality of package bodies 40 are easily formed by sawing the thinned encapsulant. However, the upper metal layer 13 is also not removed by etching as same as the lower metal layer 14, therefore, the leads 11 electrically connect each other and the leadless semiconductor packages 40 still can not be electrically tested in a matrix of a leadless leadframe before sawing.

SUMMARY OF THE INVENTION

A main purpose of the present invention is to provide a process for manufacturing leadless semiconductor packages including an electrical test in a matrix of a lead less leadframe. A leadless leadframe with a packaging matrix is provided, the packaging matrix defines a plurality of units and a plurality of cutting streets. After die attaching, wire bonding, and encapsulating, the support bars of the leadless leadframe on the cutting streets are removed. Next, a first sawing step is performed and a second sawing step is followed, an electrically testing step is interposed between the first and second sawing steps. During the first sawing step, the plated metal layer on the cutting streets is cut out, but the leadless semiconductor packages are not singulated. After testing the encapsulated chips on the packaging matrix, the individual leadless semiconductor packages are singulated during the second sawing step. Therefore, a plurality of leadless semiconductor packages can be tested at the matrix of the leadless leadframe.

According to the present invention, a process for manufacturing leadless semiconductor package including an electrical test in a matrix of a leadless leadframe is provided for lower test cost. A leadless leadframe has at least a packaging matrix, the packaging matrix defines a plurality of units and a plurality of cutting streets. Moreover, the leadless leadframe has a plurality of leads and a plurality of connecting bars. The leads are arranged inside the units, and the connecting bars connect the leads along the cutting streets. There is a plated metal layer formed on the upper surfaces of the leads and on the upper surfaces of the connecting bars. Thereafter, a plurality of chips are attached to the units of the leadless leadframe, then, a plurality of bonding wires connect the leads of the leadless leadframe and the dies. Thereafter, the packaging matrix of the leadless leadframe is encapsulated with an encapsulant to cover the upper surface of the leads and the upper surface of the connecting bars. Thereafter, the connecting bars in the cutting streets are removed by an etching process so that the leadless leadframe has a plurality of grooves at the cutting streets. The plated metal layer in the cutting streets is cut out during the first sawing step, but after the first sawing step, the leadless semiconductor packages are not singulated. So the encapsulated semiconductor chips can be tested in matrix by probing at the lower surface of the leads. Finally, after the electrical test, the second sawing step is performed so that the encapsulant is singulated to form the individual packages.

DETAIL DESCRIPTION OF THE INVENTION

Please refer to the drawings attached, the present invention will be described by means of embodiments below.

Figure 1:
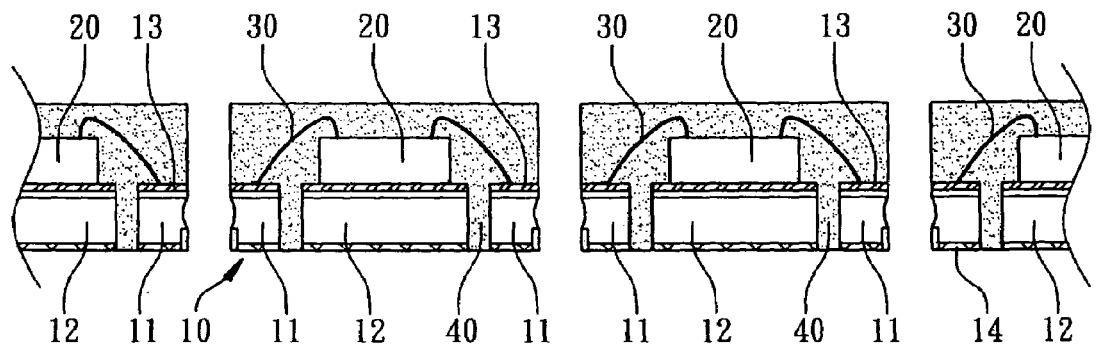
FIG. 1 is a cross-sectional view of a well-known leadless semiconductor package manufactured by a leadless leadframe with a packaging matrix.
Figure 2:
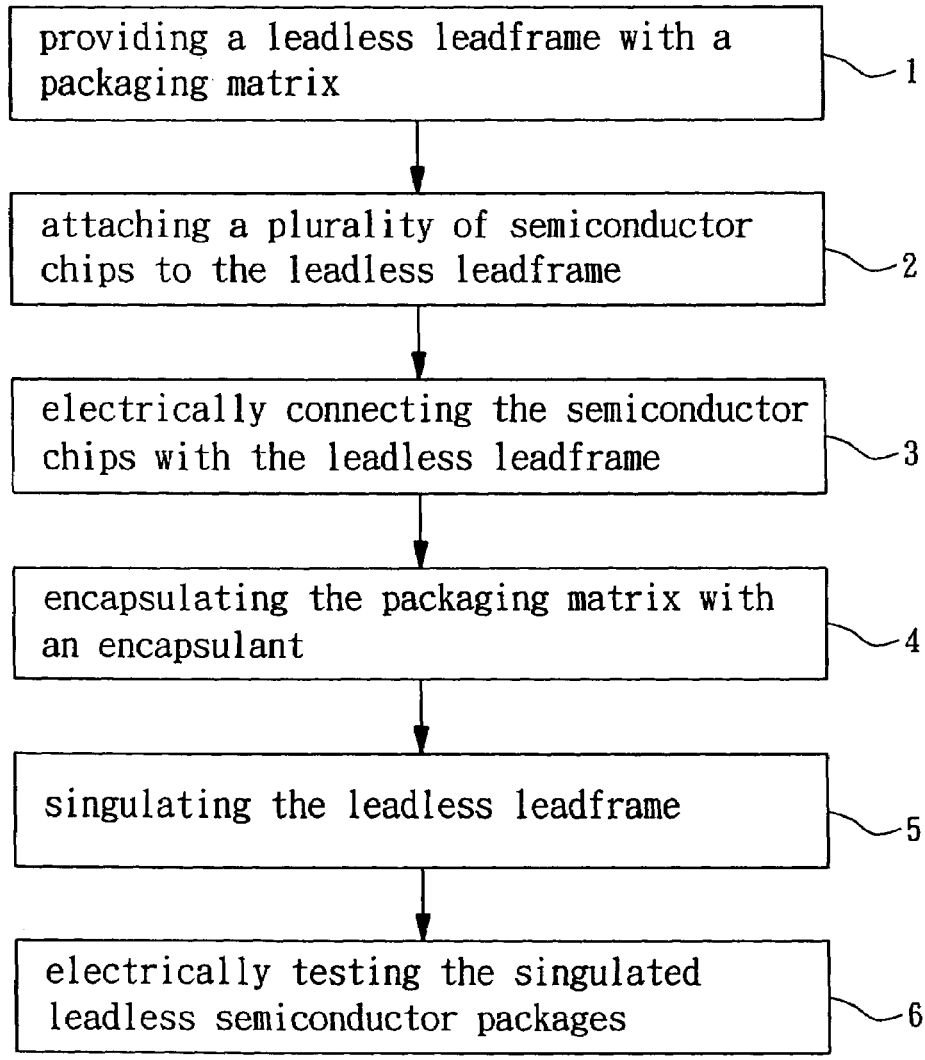
FIG. 2 is the process for manufacturing a well-known leadless semiconductor package with a leadless leadframe with a packaging matrix.
Figure 3:
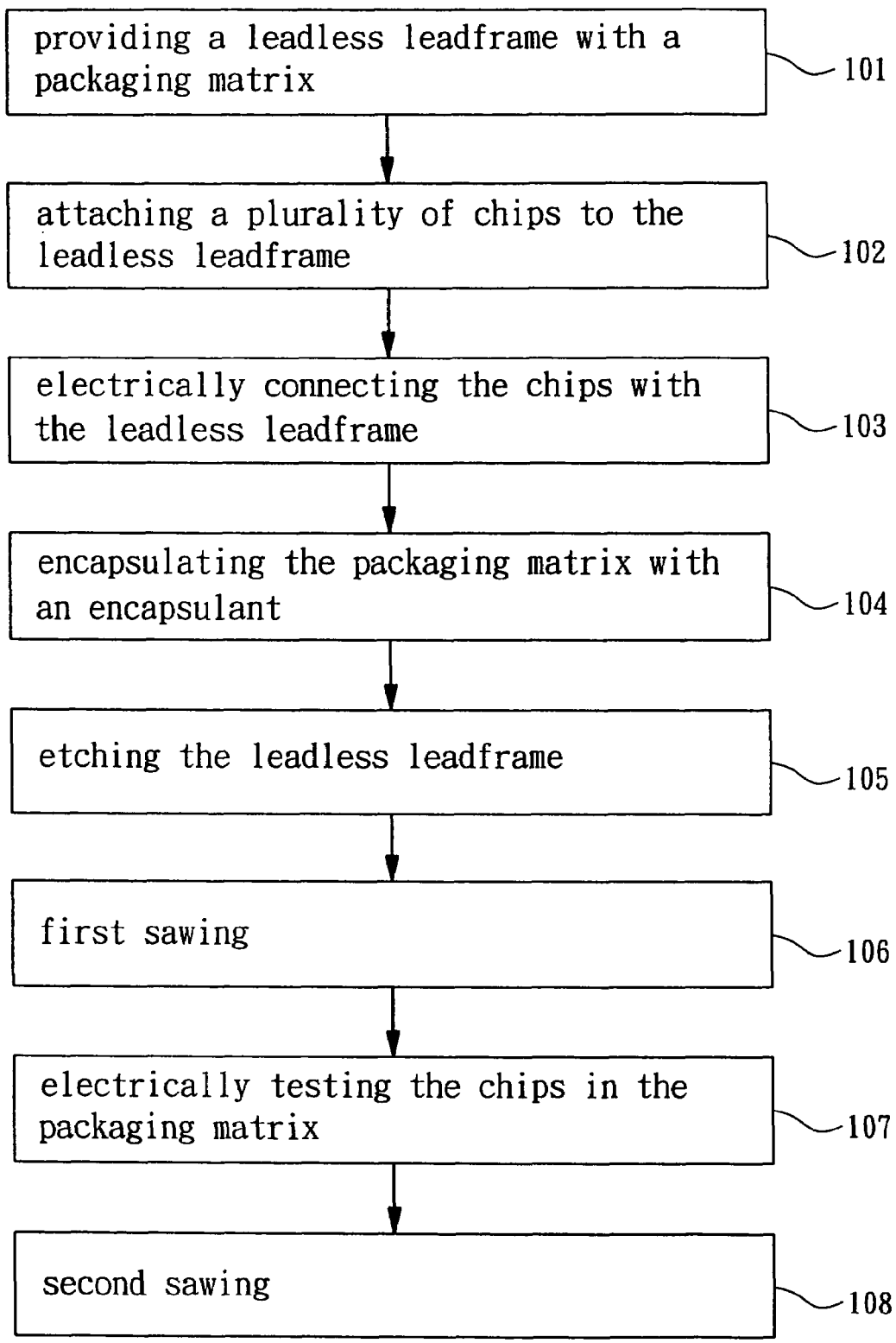
FIG. 3 is the process for manufacturing a leadless semiconductor package including testing a plurality of leadless semiconductor packages on packaging matrix of a leadless leadframe in accordance with the first embodiment of the present invention.

As shown in FIG. 3, a process for manufacturing a plurality of leadless semiconductor packages from a leadless leadframe having a packaging matrix, including: the step 101 of "providing a leadless leadframe with a packaging matrix", the step 102 of "attaching a plurality of chips to the leadless leadframe", the step 103 of "electrically connecting the chips with the leadless leadframe", the step 104 of "encapsulating the packaging matrix with an encapsulant", the step 105 of "etching the leadless leadframe", the first sawing step 106, the step 107 of "electrically testing the chips in the packaging matrix", and the second sawing step 108.

Figure 4A:
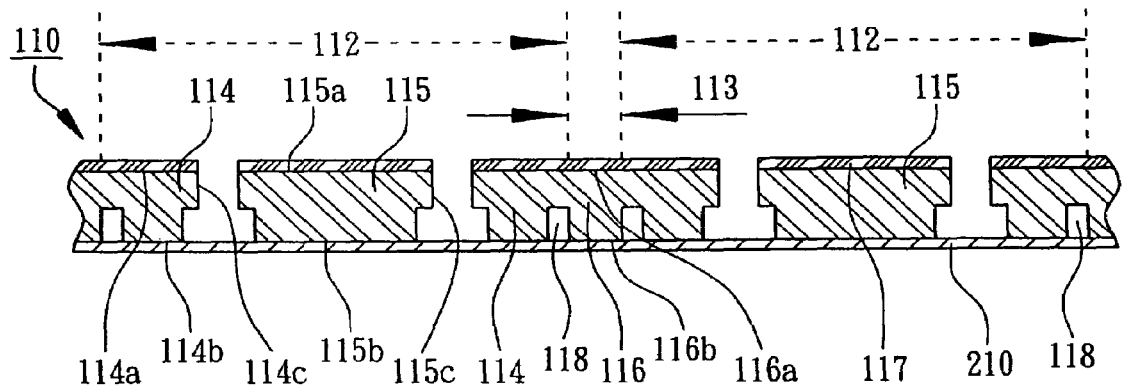
FIG. 4A to 4J are the cross-sectional views of a leadless leadframe during the manufacturing process in accordance with a first embodiment of the present invention.
Figure 5:
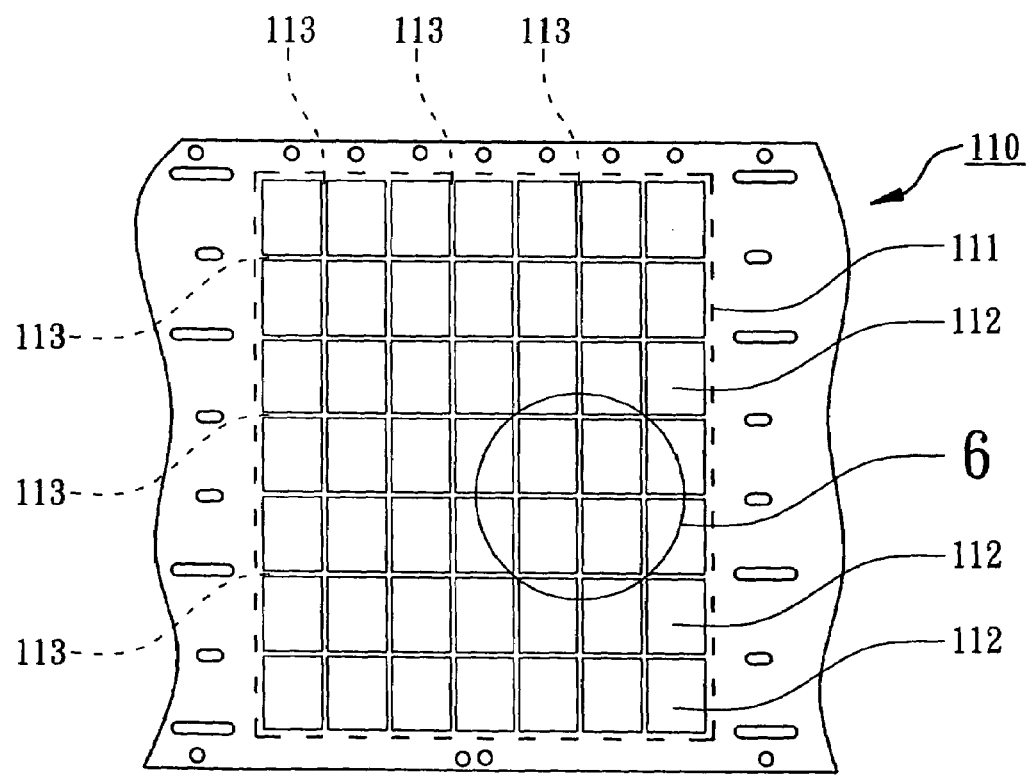
FIG. 5 is a plan view of the leadless leadframe in accordance with the first embodiment of the present invention.
Figure 6:
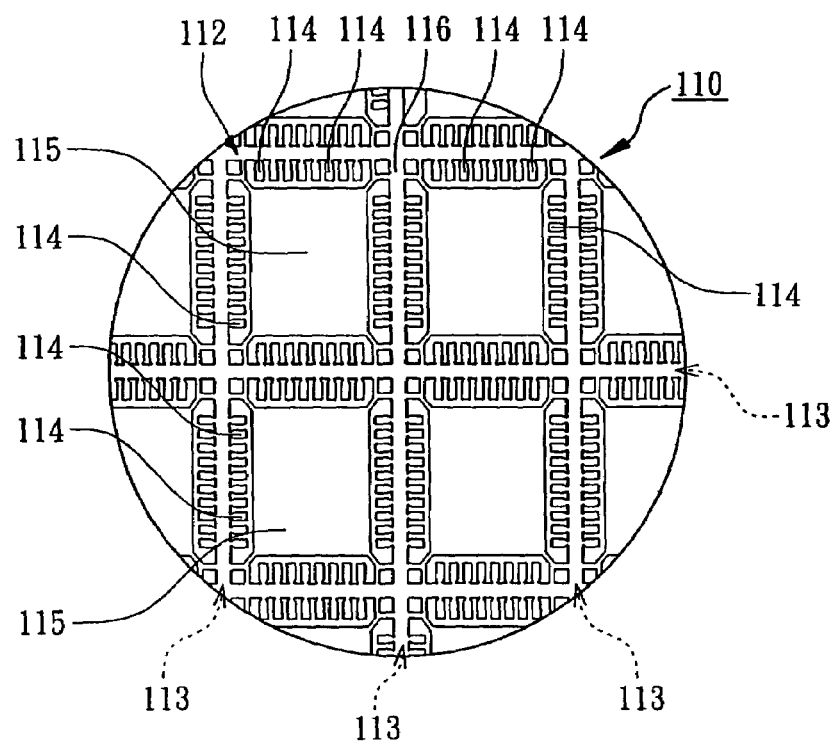
FIG. 6 is the enlargement plan view of the leadless leadframe in accordance with the first embodiment of the present invention.

Accord to the first embodiment of the present invention, firstly in the step 1, as shown in FIGS. 4A and 5, a leadless leadframe 110 with a packaging matrix 111 is provided such as a quad flat non-leaded (QFN) leadframe. The leadless leadframe is made of metal or metal alloy containing copper or iron. There is at least one packaging matrix 111 on the leadless leadframe 110, as shown in FIG. 5. In this embodiment, the leadless leadframe 110 has a plurality of packaging matrixes 111 in linear arrangement. Each packaging matrix 111 defines a plurality of units 112 and a plurality of cutting streets 113. Moreover, the leadless leadframe 110 has a plurality of leads 114 and a plurality of connecting bars 116. A plurality of leads 114 are arranged at the periphery of each unit 112. The plurality of connecting bars 116 are formed inside the packaging matrix 111 along the cutting streets 113 to connect the leads 114. In this embodiment, a plurality of the chip pads 115 are formed in the corresponding units 112 and are connected with the leadless leadframe 110 by the tie bars, as shown in FIG. 6. The plurality of chip pads 115 are surrounded by the leads 114, as shown in FIG. 6. As shown in FIG. 4A a plated metal layer 117, such as silver, nickel/gold, is formed on the upper surface 114a of the leads 114 and the upper surface 116a of the connecting bars 116. Preferably, an indentation 118 is formed between the leads 114 and the connecting bars 116. Moreover, a back tape 210 is attached to the lower surfaces 114b of the leads 114, the lower surfaces 115b of the chip pads 115, and the lower surfaces 116b of the connecting bars 116 to reinforce the strength of the leadless leadframe during the packaging process and to prevent mold flash of the encapsulant.

Figure 4B:
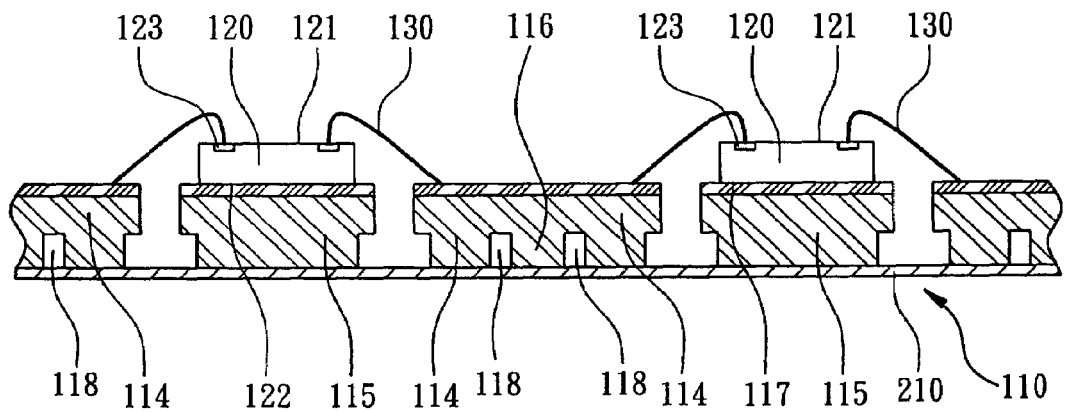

Thereafter, as shown in FIG. 4B, a plurality of chips 120 are disposed in the units 112 of the leadless leadframe 110 in step 102. Each chip 120 has an active surface 121 and a backside surface 122. A plurality of bonding pads 123 are formed on the active surfaces 121 of the chips 120. The backside surfaces 122 of the chips 120 are attached to the upper surface 115a of the chip pads 115 through an adhesive tape or glue, not shown in the figure. Next, the bonding pads 123 of the chips 120 are electrically connected to the leads 114 of the leadless leadframe 110 by a plurality of bonding wires 130 in step 103.

Figure 4C:
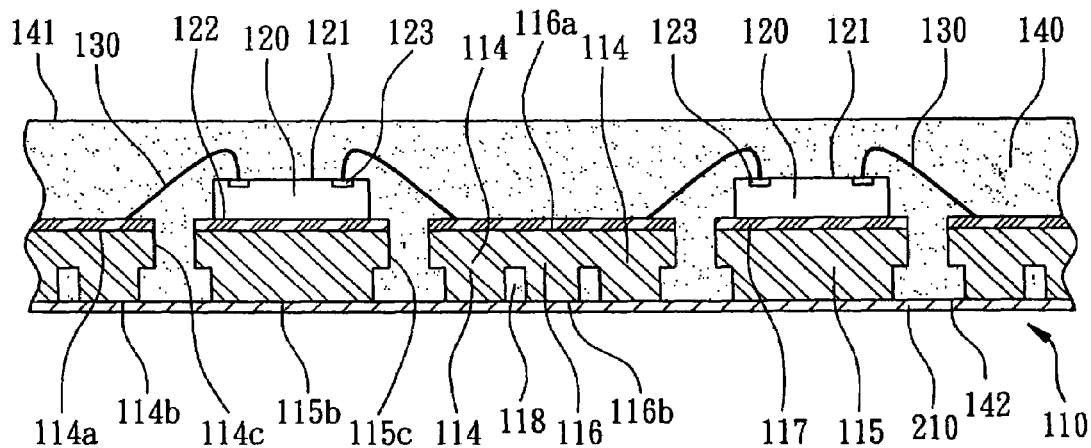
Figure 4D:
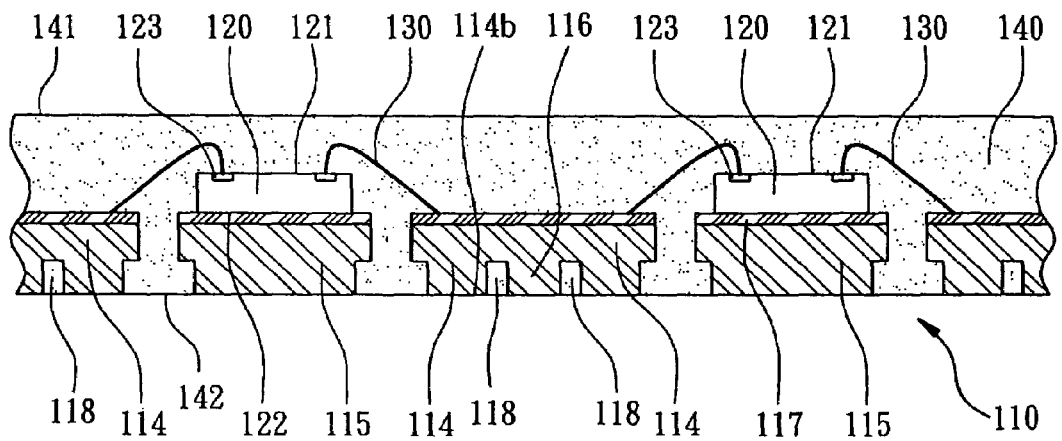

Thereafter, as shown in FIG. 4C, an encapsulant 140 is used to seal the packaging matrix 111 of the leadless leadframe 110 as shown in step 104. The encapsulant 140 can be manufactured by means of molding or printing to fully cover the upper surfaces 114a and the sides 114c of the leads 114, and the upper surfaces 116a and the sides 116c of the connecting bars 116. Moreover, the encapsulant 140 also completely fills the indentations 118 to bond the leads 114 and to prevent the lower surfaces 114b of the leads 114 from over-etching during etching the lower surfaces 116b of the connecting bars 116. In this embodiment, the top 141 of the encapsulant 140 is higher than the active surface 121 of the chips 120 and the loop height of the bonding wires 130. The bottom 142 of the encapsulant 140 is formed on the back tape 210 without covering the lower surfaces 114b of the leads 114. After step 104, as shown in FIG. 4D, the back tape 210 is removed for the next etching step 105. The lower surfaces 114b of the leads 114 and the lower surfaces 115b of the chip pads 115 are exposed from the encapsulant 140. In this embodiment, the lower surfaces 114b of the leads 114 and the lower surfaces 115b of the chip pads 115 are coplanar.

Figure 4E:
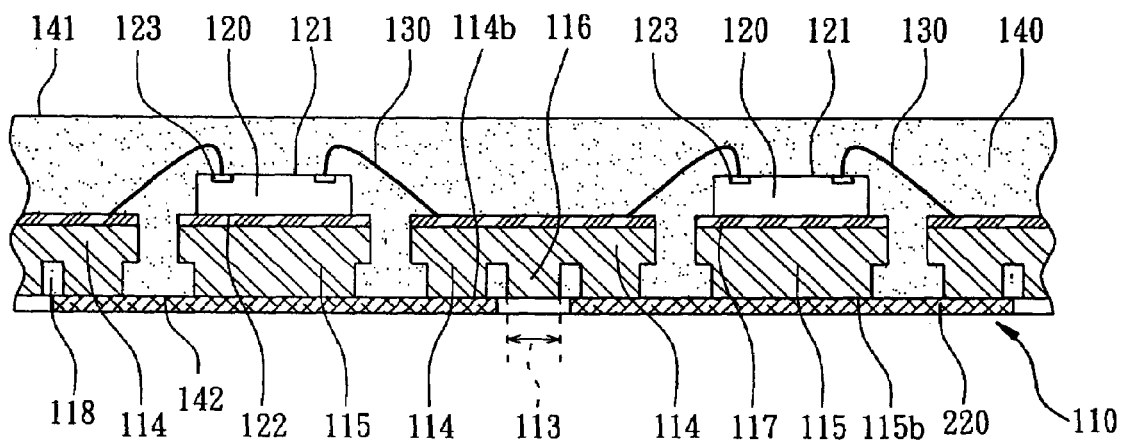
Figure 4F:
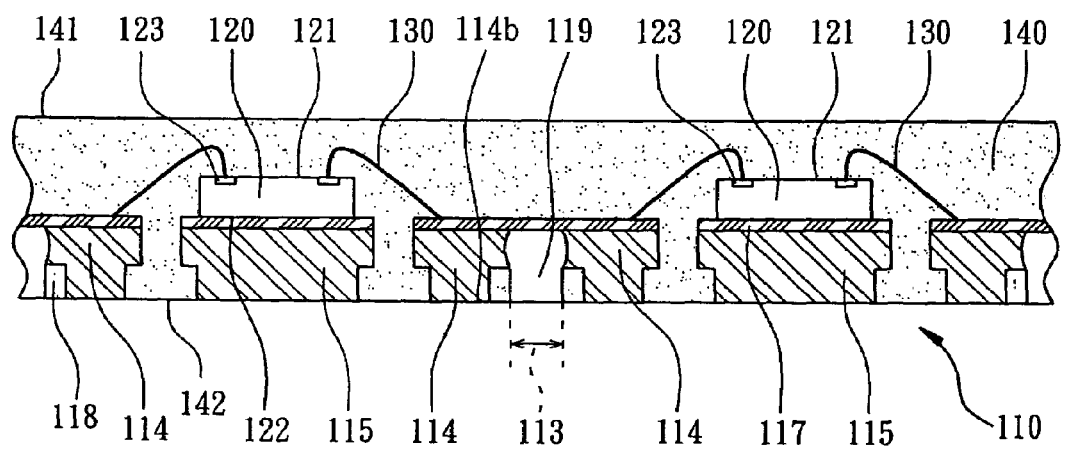

Thereafter, in step 105, the leadless leadframe 110 passes through an etching process to remove the connecting bars 116 corresponding to the cutting streets 113 as shown in FIGS. 4E and 4F. In FIG. 4E a photo-sensitive tape 220 is attached to the leadless leadframe 110 and the lower surface 142 of the encapsulant 140. Then the photo-sensitive tape 220 is exposed and patterned to remove a portion of the photo-sensitive tape 220 corresponding to the cutting streets 113 so that the lower surface 116b of the connecting bars 116 is exposed. Next, as shown in FIG. 4F the connecting bars 116 in the cutting streets 113 is removed by a wet etching process, so that a plurality of groove 119 are formed on the bottom 142 of the encapsulant 140 corresponding to the cutting streets 113. The grooves 119 expose the plated metal layer 117 on the connecting bars 116. The thickness from the groove 119 to the top 141 of the encapsulant 140 is smaller than the total thickness of the encapsulant 140 so that the following sawing steps 106 and 108 can be easily performed.

Figure 4G:
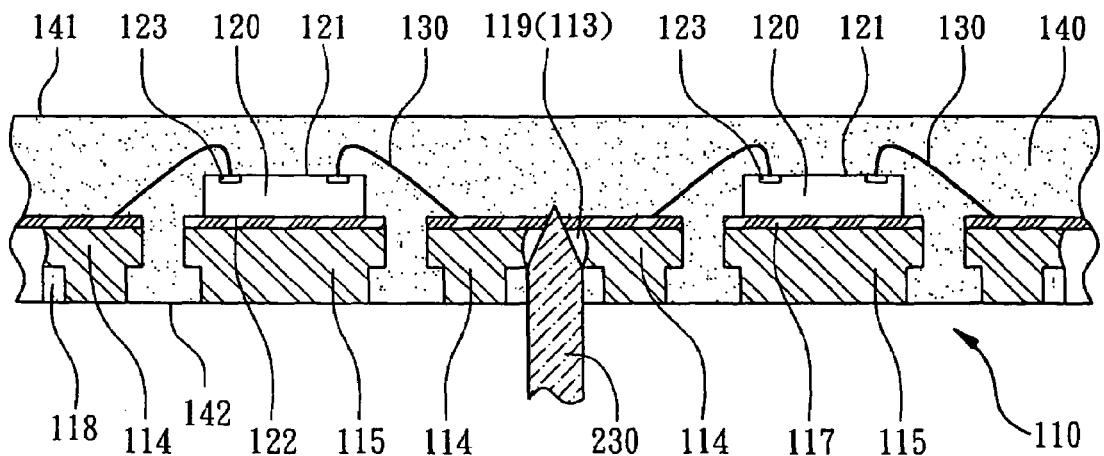

Thereafter, as shown in FIG. 4G, the first sawing step 106 is performed. A sawing blade 230 cuts the plated metal layer 117 in the grooves 119 (the cutting streets 113) from the bottom 142 of the encapsulant 140. Thus the leads 114 are electrically isolated, also the chip pads 115 are electrically isolated, but the encapsulant 140 is not separated. Therefore, an electrical testing step 107 can be performed.

Figure 4H:
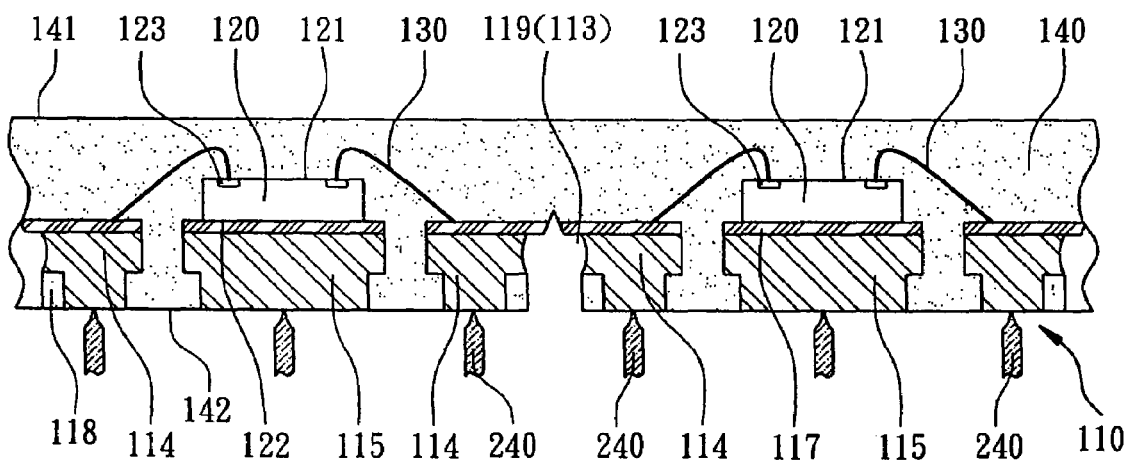

Thereafter, as shown in FIG. 4H, the encapsulated chips 120 in the packaging matrix 111 are electrically tested in step 107 after the first sawing step 107. The probes 240 of a semiconductor tester probe at the lower surfaces 114b of the leads 114 and the lower surfaces 115b of the chip pads 115 so that the chips 120 inside the encapsulant 140 can be electrically tested at matrix type.

Figure 4I:
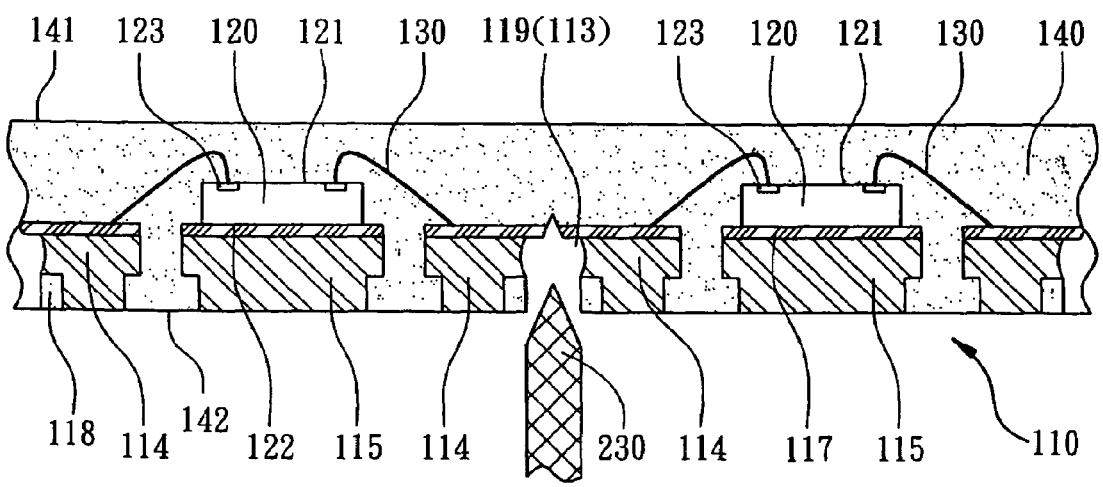
Figure 4J:
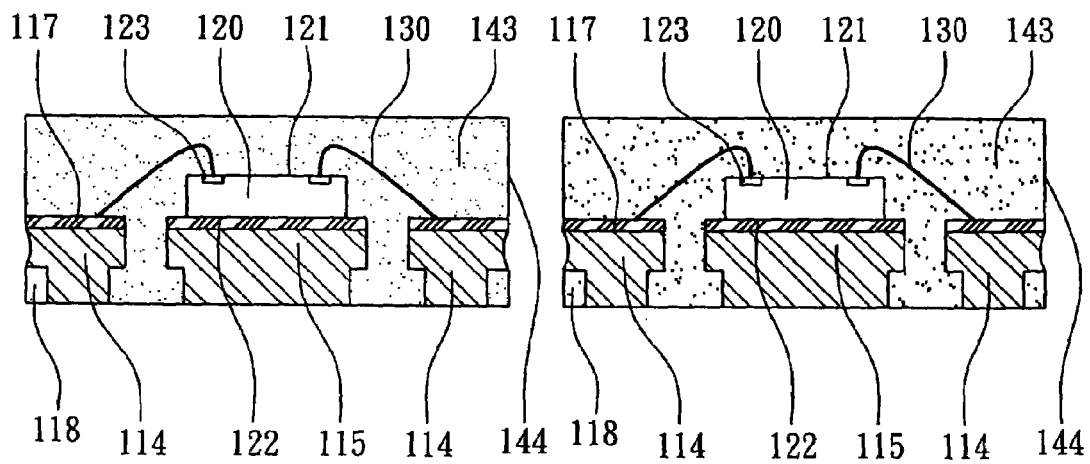

Thereafter, as shown in FIG. 4I, after finishing the electrical testing step 107, the second sawing step 108 is performed. The sawing blade 230 cuts the encapsulant 140 along the grooves 119 (cutting streets 113) to form a plurality of individual package bodies 143 of the leadless semiconductor packages which are electrically tested, as shown in FIG. 4J. After the second sawing step 108, each individual package bodies 143 has a sidewall 144 perpendicular to the lower surfaces 114b of the leads 114.

Therefore, according to the present invention, the electrically testing step 107 is performed between the first sawing step 106 and the second sawing step 108. Prior to the second sawing step 108 to singulate the encapsulant 140, the encapsulated chips 120 are tested in matrix type in step 107. The conventional indexing time including loading and unloading the packages during socket type testing is saved, therefore, the testing cost can be reduced. Moreover, in the second sawing step 108, the sawing blade 230 can easily cut from the grooves 119 to the top 141 of the encapsulant 140 to reduce the wearing of the sawing blade and increase the sawing efficiency.

Figure 7A:
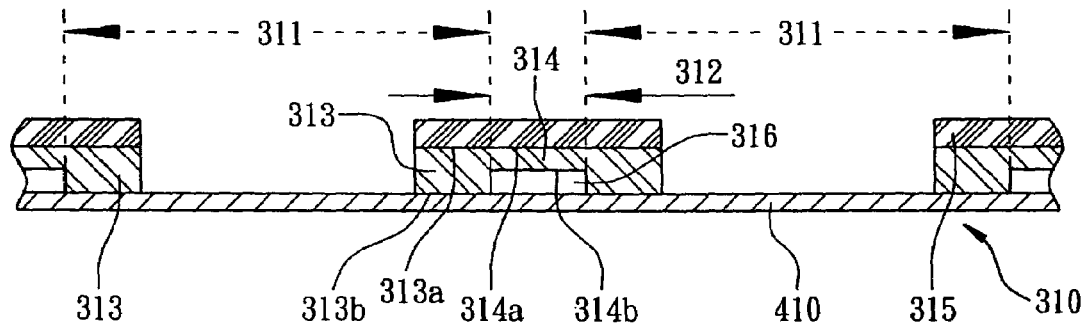
FIG. 7A to 7J are the cross-sectional views of a leadless leadframe during manufacturing process in accordance with a second embodiment of the present invention.

According to the second embodiment of the present invention, as shown in FIG. 7A, another leadless leadframe 310 with a packaging matrix in step 101 is provided. There is at least a packaging matrix, not shown in the figure, in the leadless leadframe 310. The packaging matrix defines a plurality of units 311 and a plurality of cutting streets 312. Moreover, the leadless leadframe 310 has a plurality of leads 313 and a plurality of connecting bars 314. The leads 313 are formed in the units 311 and are connected with the connecting bars 314 along the cutting streets 312. A plated metal layer 315, such as gold-palladium-nickel-palladium or other unetchable metal layer, is deposited on the upper surface 313a of the leads 313 and the upper surface 314a of the connecting bars 314, preferably, an indentation 316 is formed on the lower surfaces 314b of the connecting bars 314 corresponding to the cutting streets 312. A back tape 410 is attached to the lower surface of the leadless leadframe 310. In the present embodiment, the leadless leadframe 310 is not necessary to have chip pads because that the chip 320 can be attached to the back tape 410 directly.

Figure 7B:
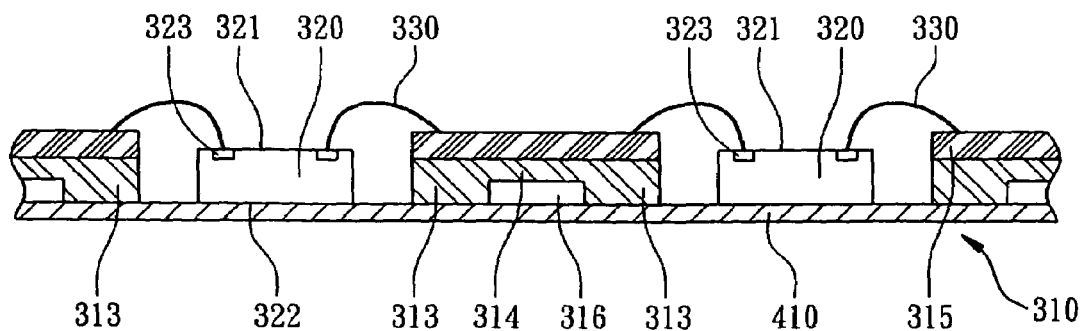

Thereafter, as shown in FIG. 7B, a plurality of chips 320 are disposed in the units 311 of the leadless leadframe 310 in step 102 by attaching the backside surface 322 of the chip 320 to the back tape 410. Each chip 320 has a plurality of bonding pads 323 on its active surface 321. Then, in step 103, a plurality of bonding wires 330 connect the bonding pads 323 of the chip 320 with the leads 313 of the leadless leadframe 310 by.

Figure 7C:
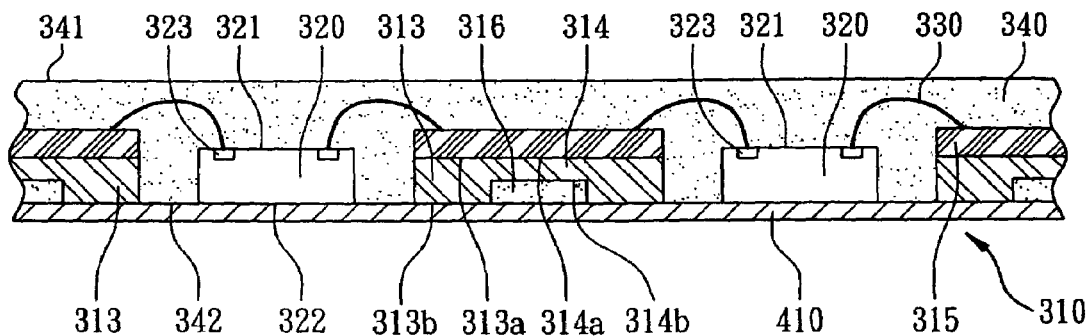
Figure 7D:
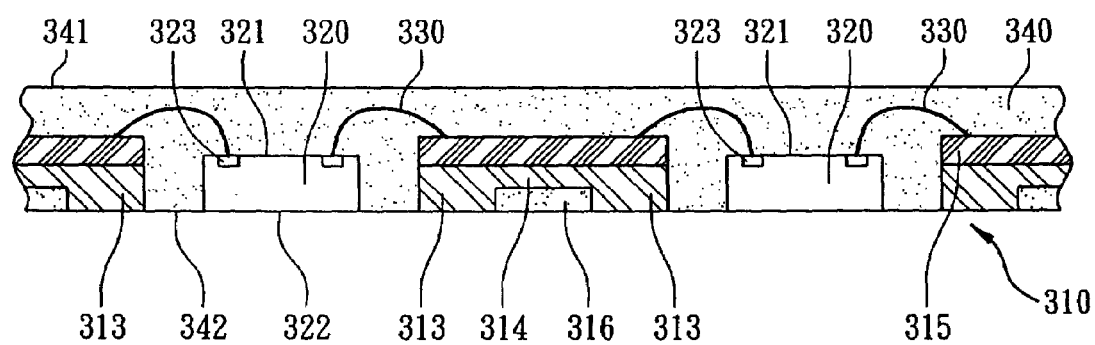

Thereafter, as shown in FIG. 7C, an encapsulant 340 is molded or printed on the packaging matrix of the leadless leadframe 310 to cover the plated metal layer 315 on the upper surface 313a of the leads 313 and the upper surfaces 314a of the connecting bars 314 in step 104. Moreover, the encapsulant 340 also completely fills the indentations 316. Then, as shown in FIG. 7D, the back tape 410 is removed so that the leadless leadframe 310 can be etched.

Figure 7E:
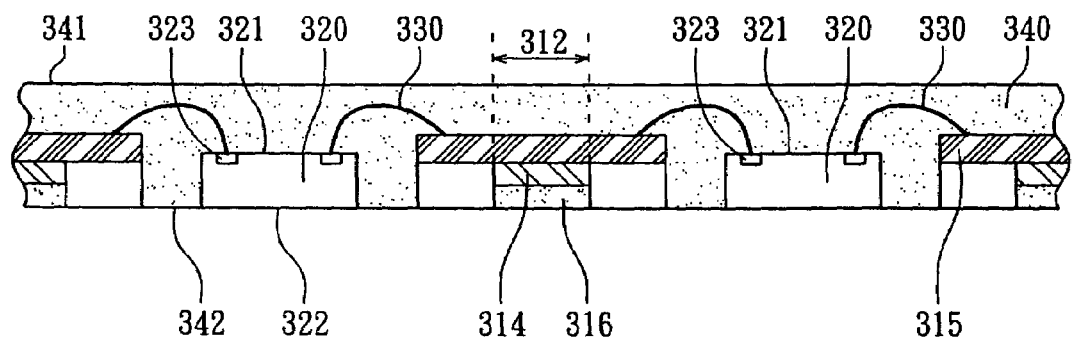
Figure 7F:
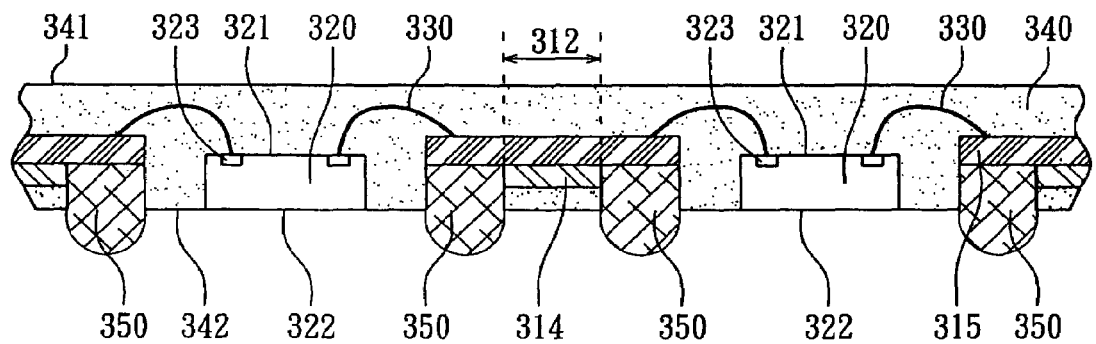

Thereafter, as shown in FIG. 7E, in this embodiment, the leads 313 of the leadless leadframe 310 is removed by a wet etching process in step 105. Then, as shown in FIG. 7F, a plurality of solder balls 350 are placed on the plated metal layer 315 as outer terminals, which is formed on the bottom of the encapsulant 340 in step 105 or the other steps.

Figure 7G:
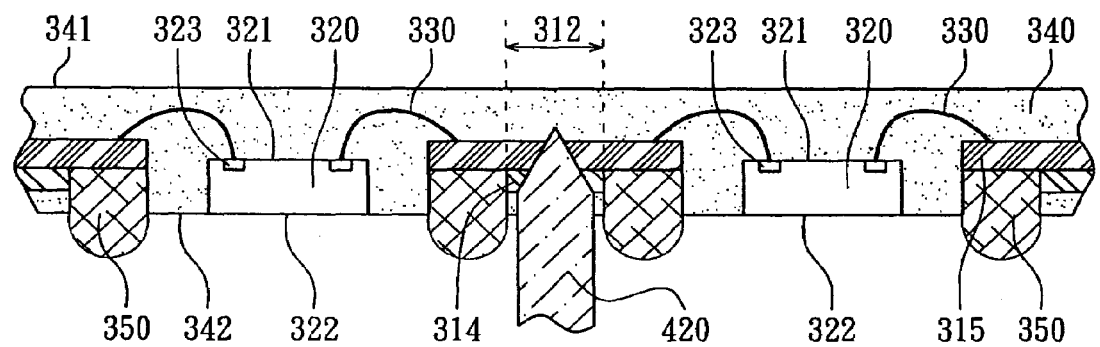

Thereafter, as shown in FIG. 7G, a sawing blade 420 cuts off the plated metal layer 315 along the cutting streets 312 in the first sawing step 106 so that the plated metal layer 315 on the upper surfaces 313a of the leads 313 are electrically isolated in step 106. Then an electrically testing can be performed.

Figure 7H:
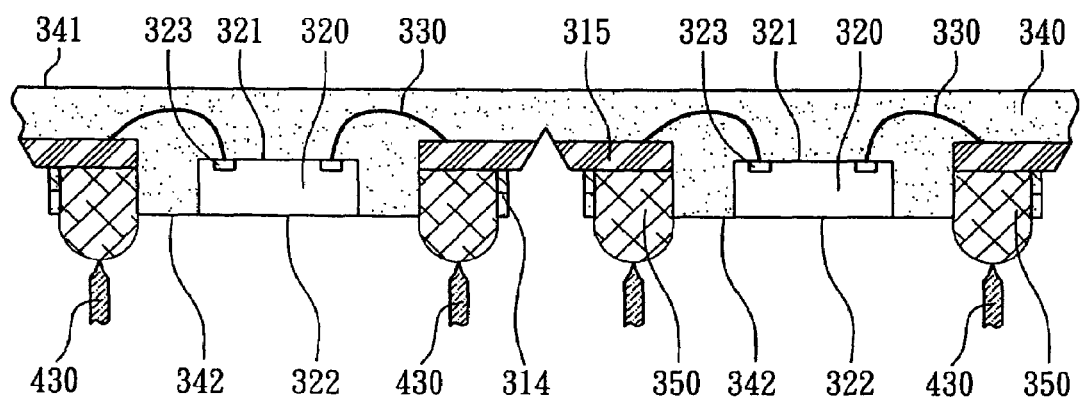

Thereafter, as shown in FIG. 7H, after the first package sawing step 106, the probes 430 or test sockets of a semiconductor tester connect the solder balls 350 to electrically connect to the separated plated metal layer 315 to electrically test the chip 320 sealed by the encapsulant 340 in step 107.

Figure 7I:
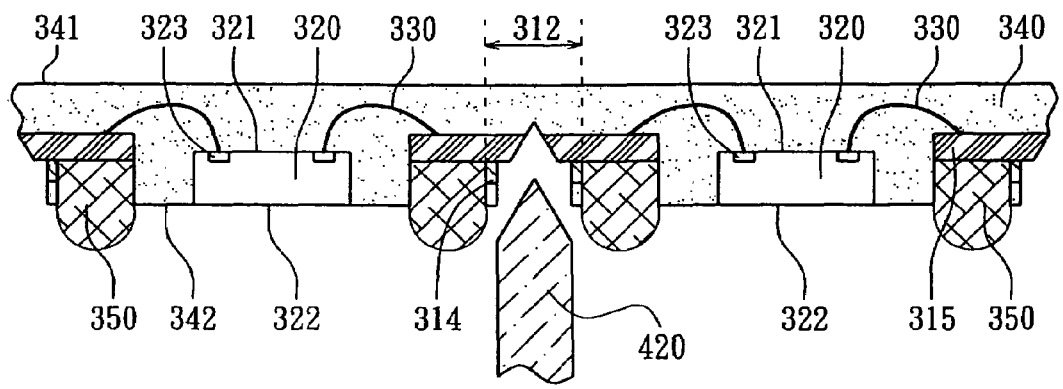
Figure 7J:
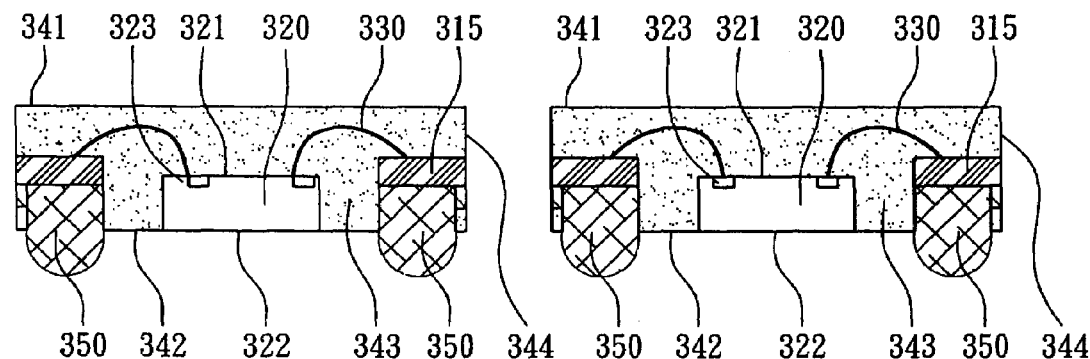

Thereafter, as shown in FIG. 7I, after the electrically testing step 107, the second sawing step 108 is performed. The sawing blade 420 cut the encapsulant 340 along the cutting streets 312 to form a plurality of individual package bodies 343 of leadless semiconductor packages which have been electrically tested, as shown in FIG. 7J. Each package body 343 has a sidewall 342 which is formed after the second sawing step 108. The sidewall 342 is perpendicular to the bottom 342 of the package body 343.

Figure 8:
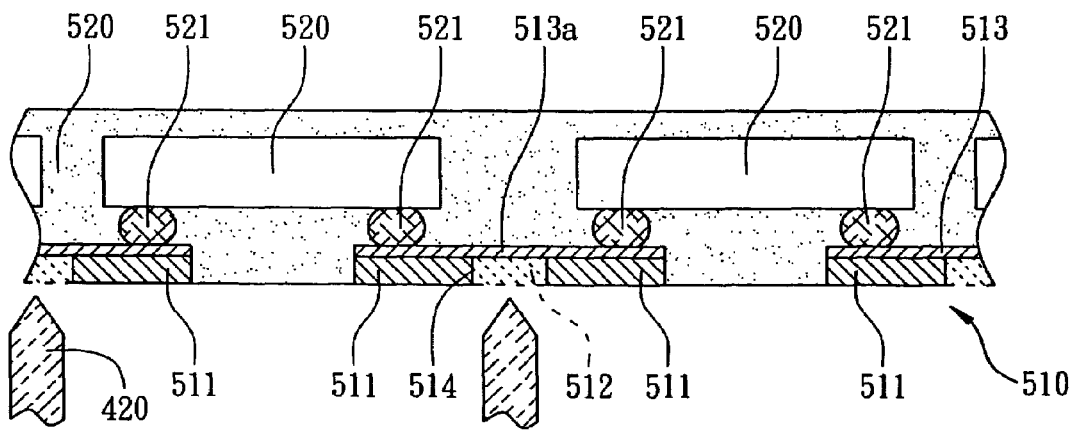
FIG. 8 is the cross-sectional view of a leadless leadframe during a first sawing step of a manufacturing process in accordance with a third embodiment of the present invention.

According to a third embodiment of the present invention, a process for manufacturing a plurality of leadless semiconductor packages from a leadless leadframe having a packaging matrix includes the steps similar to the steps as shown in FIG. 3, except the chip-attaching step 102 and the wire-bonding step 103 are replaced with a flip-chip bonding step. Referring to FIGS. 3 and 8, a leadless leadframe 510 is provided in step 101, which has a packaging matrix including a plurality of leads 511 in each units and a plurality of connecting bars 512 between the units. The leads 511 are connected to the connecting bars 512. A plated metal layer 513 is formed on the upper surfaces of the leads 511 and on the upper surfaces of the connecting bars 512, the plated metal layer 513 is Ni/Pd/Au in this embodiment. A plurality of chips 520 are flip-chip bonded to the units of the leadless leadframe 510, skipping the step 102 and 103. Bumps 521 of the chips 520 connect the plated metal layer 513 on the leads 511 so as to electrically connect the chips 520 and the leadless leadframe 510. An encapsulant 530 is formed on the packaging matrix of the leadless leadframe 510 to cover the plated metal layer 513 on the upper surfaces of the leads 511 and the connecting bars 512 in the step 104. The connecting bars 512 are etched off to form a plurality of grooves 514 in the step 105, so that portions 513a of the plated metal layer 513 are exposed out of the grooves 514. In the first sawing step 106, using a sawing blade 610, the exposed plated metal layer 513a in the grooves 514 are cut out to electrically isolate the chips 520. Thus the electrically testing step 107 can be performed to test the encapsulated flip chips 520 in matrix type by means of contact of a probe card (not shown in figure). Next, the second sawing step 108 is performed, the encapsulant 530 is cut along the grooves 514 to form a plurality of individual package bodies of the leadless semiconductor packages.

The above description of embodiments of this invention is intended to be illustrative and not limiting. Other embodiments of this invention will be obvious to those skilled in the art in view of the above disclosure.

What is claimed is:

1. A process for manufacturing a plurality of leadless semiconductor packages, comprising:
providing a leadless leadframe having a packaging matrix, the packaging matrix having a plurality of units and a plurality of connecting bars, wherein each unit has a plurality of leads connected to the connecting bars, a plated metal layer is formed on the upper surfaces of the leads and the upper surfaces of the connecting bars;
disposing a plurality of chips in the units;
wire-bonding the chips and the leads of the leadless leadframe;
forming an encapsulant on the packaging matrix of the leadless leadframe to cover the chips and the plated metal layer on the upper surfaces of the leads and the connecting bars;

removing portions of the connecting bars to form a plurality of grooves corresponding to the connecting bars;
performing a first sawing step to cut out the plated metal layer in the grooves;
probing the lower surfaces of the leads after performing the first sawing step for electrically testing the packaged chips; and
performing a second sawing step after the electrical testing, the encapsulant being cut along the grooves to form a plurality of individual package bodies of the leadless semiconductor packages.

2. The process of claim 1, wherein the connecting bars are removed by a wet etching process.

3. The process of claim 1, further comprising: attaching a photo-sensitive tape to the lower surfaces of the leads, wherein the photo-sensitive tape is exposed and developed to expose the connecting bars for etching.

4. The process of claim 1, wherein the leadless leadframe has a plurality of indentations between the leads and the connecting bars.

5. The process of claim 4, wherein the indentations are filled with the encapsulant.

6. The process of claim 1, wherein a back tape is attached to the lower surface of the leadless leadframe for forming the encapsulant.

7. The process of claim 6, wherein the back tape is removed after forming the encapsulant.

8. The process of claim 1, wherein the plated metal layer is silver.

9. The process of claim 1, wherein the leadless leadframe is a QFN leadframe.

10. The process of claim 1, wherein the lower surfaces of the leads are coplanar.

11. The process of claim 1, wherein the leadless leadframe has a plurality of chip pads in the units.

12. The process of claim 1, wherein each package body has a sidewall perpendicular to the lower surfaces of the leads after the second sawing step.

13. A process for manufacturing a plurality of leadless semiconductor packages, comprising:
providing a leadless leadframe having a packaging matrix, the packaging matrix defining a plurality of units and a plurality of cutting streets, a plated metal layer being formed on the units and the cutting streets;
disposing a plurality of chips in the units;
electrically connecting the chips with the plated metal layer;
forming an encapsulant on the packaging matrix to cover the chips, the units and the cutting streets;
etching the leadless leadframe;
performing a first sawing step to cut out the plated metal layer along the cutting streets;
electrically testing the encapsulated chips through the plated metal layer by probing after the first sawing step; and
performing a second sawing step after the electrically testing step, the encapsulant being cut along the cutting streets to form a plurality of individual package bodies of the leadless semiconductor packages.

14. The process of claim 13, wherein the leadless leadframe is etched to expose the plated metal layer.

15. The process of claim 13, wherein the leadless leadframe has a plurality of indentations on the lower surface of the leadless leadframe corresponding to the cutting streets.

16. The process of claim 15, wherein the indentations are filled with the encapsulant.

17. The process of claim 13, wherein a back tape is attached to the lower surface of the leadless leadframe.

18. The process of claim 17, wherein the back tape is removed after forming the encapsulant.

19. The process of claim 13, wherein the plated metal layer is unetchable.

20. The process of claim 13, wherein the leadless leadframe is a QFN leadframe.

21. The process of claim 13, wherein each package body has a sidewall perpendicular to its bottom after the second sawing step.

22. The process of claim 13, further comprising: forming a plurality of outer terminals connecting the plated metal layer.

23. A process for manufacturing a plurality of leadless semiconductor packages, comprising:
providing a leadless leadframe having a packaging matrix, the packaging matrix having a plurality of units and a plurality of connecting bars, wherein each unit has a plurality of leads connected to the connecting bars, a plated metal layer is formed on the upper surfaces of the leads and the upper surfaces of the connecting bars;
bonding a plurality of chips to the units and electrically connecting the chips to the plated metal layer on the leads;
forming an encapsulant on the packaging matrix of the leadless leadframe to cover the plated metal layer on the upper surfaces of the leads and the connecting bars;
etching the connecting bars to form a plurality of grooves exposing portions of the plated metal layer;
performing a first sawing step to cut out the exposed plated metal layer in the grooves;
electrically testing the encapsulated chips after the first sawing step; and
performing a second sawing step after the electrical testing, the encapsulant being cut along the grooves to form a plurality of individual package bodies of the leadless semiconductor packages.

24. The process of claim 23, wherein the chips are flip-chip bonded to the plated metal layer on the upper surfaces of the leads.

25. The process of claim 23, wherein the plated metal layer is Ni/Pd/Au.

26. The process of claim 23, wherein the lower surfaces of the leads are coplanar.

* * * * *